United States Patent [19]
Kutal

[11] Patent Number: 5,691,113
[45] Date of Patent: Nov. 25, 1997

[54] ANIONIC PHOTOINITIATION

[75] Inventor: Charles R. Kutal, Athens, Ga.

[73] Assignee: The University of Georgia Research Foundation, Inc., Athens, Ga.

[21] Appl. No.: 325,623

[22] Filed: Oct. 18, 1994

Related U.S. Application Data

[63] Continuation of Ser. No. 790,355, Nov. 12, 1991, abandoned.

[51] Int. Cl.$^6$ ................................................ G03C 1/735
[52] U.S. Cl. ............................. 430/274.1; 430/283.1; 430/289.1; 430/914; 522/65; 522/66
[58] Field of Search ........................... 430/270, 281, 430/274, 289, 283, 914; 522/65, 66

[56] References Cited

U.S. PATENT DOCUMENTS

| | | | |
|---|---|---|---|
| 3,794,497 | 2/1974 | MacDonald et al. | 96/115 P |
| 4,094,852 | 6/1978 | Sundermann et al. | 260/37 N |
| 4,130,426 | 12/1978 | Takeda et al. | 430/151 |
| 4,184,874 | 1/1980 | Takeda | 430/336 |
| 4,675,270 | 6/1987 | Woods et al. | 430/311 |
| 4,707,432 | 11/1987 | Gatechair et al. | 430/281.1 |
| 4,857,654 | 8/1989 | Reidiker et al. | 556/53 |
| 4,963,300 | 10/1990 | Meier et al. | 264/22 |
| 4,985,340 | 1/1991 | Palazzotto et al. | 430/270.1 |
| 4,992,572 | 2/1991 | Desobry et al. | 556/140 |
| 5,059,701 | 10/1991 | Keipert | 556/13 |
| 5,091,439 | 2/1992 | Berner et al. | 522/26 |
| 5,143,785 | 9/1992 | Pujol et al. | 428/352 |
| 5,215,860 | 6/1993 | McCormick et al. | 430/270.1 |

OTHER PUBLICATIONS

Aslam et al., "Photopolymerization of Vinyl Monomer Initiated by Diacidobis (Ethylenediamine) Cobalt (III) Complexes," *Polymer Photochemistry*, 5:41–48 (1984).

Curtis, Hilary, et al., "Organometallic Photoinitiated Polymerisations," University Chemical Laboratory, Lensfield Road, Cambridge CB2 1RL.

Delzenne, G.A., et al., "Photopolymerization of Vinyl Monomers Initiated by Pentaaminecobalt (III) Complexes," *J. Polymer Science*, No. 16, pp. 1027–1036 (1967).

Fukuchi, Y., et al., "Photoinitiated Anionic Coordination Polymerization of Epoxides, a Novel Polymerization Process," *Macromolecules*, 20:2316–2317 (1987).

Lewis, F.D., et al., "Electronic Structure and Spectroscopy of Nickel (II), Palladium (II), Acetylacetonate Complexes," *Inorg. Chem.*, 32:1251–1258 (1993).

Polyakoya, A.M., "Effect of Impurities on the Photochemical Polymerization of Ethyl α–Cyanacrylate," *Chem. Abstracts*, 100:34900s.

Mahnken et al, "Photochemically Induced Binding of Rh(Pher)$_2$ Cl$_2$+ to DNA", Photochem. Photobiol. 1989, 49, (4), 519–522.

Aslam et al, Chemical Abstract: 101(18) 1523882.

Kutal et al. "New Inorganic PhotoInitiators for Deep UV ... ".

Kutal et al "Novel Base Generating Photointiators for ... ".

Kutal et al. "Photoinitiated Crosslinking and Image formation ... ".

Principles of Polymerization, by George Odian, Second Edition, 1981, pp. 372–402.

The Encyclopedia of Polymer Science and Engineering, vol. 2, "Anionic Polymerization to Cationic Polymerization," John Wiley and Sons, New York, 1985, pp. 1–42.

Natarajan and Santappa, "Polymerization of Acrylamide and Methacrylamide Photoinitiated by Azidopentamminecobalt(III) Chloride", *Journal of Polymer Science, Part A–1*, vol. 6, 3245–3257 (1968).

Kutal et al, "New Inorganic Photoinitiators for Deep–UV Resist Materials", *Journal of Coatings Technology*, Jul. 1990, vol. 62, No. 786, pp. 63–67.

Kutal et al, "Novel Base–Generating Photoinitiators for Deep–UV Litography", *SPIE–The International Society for Optical Engineering*, vol. 1466, Mar. 4–5, 1991.

Kutal et al, "Photoinitiated Cross–Linking and Image Formation in Thin Polymer Films Containing a Transition Metal Compound", *Journal of the Electrochemical* vol. 134, No. 9, Sep. 1987, pp. 2280–2285.

Chemical Abstracts, 100:7215r, Korshak, V.V., "Photoinitiation of polymerization of ethyl a–cyanoacrylate".

Chemical Abstracts, 106:333490v, Ashkhotova, L.M., "Effect of Impurities on the photochemical polymerization of ethyl a–cyanoacrylate".

Chemical Abstracts, 107:24498x, Kimura, Kaoru, et al., "Photocurable acrylic adhesives".

Chemical Abstracts, !)):34900s, Said–Galiev, E.E., et al., "Temperature dependence of the photopolymerization rate of ethyl a–cyanoacrylate".

Primary Examiner—Kathleen Duda
Attorney, Agent, or Firm—Kilpatrick Stockton LLP

[57] ABSTRACT

A method for the anionic photoinitiation of a substrate that includes exposing the substrate to an inorganic complex that releases an anionically charged nucleophile on irradiation.

18 Claims, 1 Drawing Sheet

ANIONIC PHOTOINITIATION

This is a continuation of application Ser. No. 07/790,355 filed on Nov. 12, 1991, now abandoned.

The government has rights in this invention by virtue of the partial funding of work leading to this invention through National Science Foundation Grant No. DMR-8715635.

Photoinduced reactions of functionalized monomers, oligomers, and polymers play a prominent role in technologies that contribute an estimated $25 billion per year to the world economy. Important commercial applications include the ultraviolet curing of coatings, the photoimaging of semiconductor chips, and the light-driven storage and output of visual information.

Photochemical or photoinitiated reactions occur when a reactive species is produced on exposure of the reaction mixture to light. The simplest mechanism for processes of this type involves the direct photochemical conversion of a substrate to a final product (eq. 1). If the substrate does not absorb the incident radiation, or does not form a reactive intermediate on exposure to the radiation, a second compound, referred to as

(1)

(2)

(3)

a photoinitiator (P), can be added that absorbs incident light strongly and undergoes a photochemical transformation to one or more reactive species I (eq. 2). Interaction of I with the substrate results in product formation (eq. 3). Since the photoinitiator and substrate serve different functions, it is possible to optimize the properties of one without affecting the desirable features of the other. This inherent flexibility of a two-component system greatly simplifies the task of designing radiation-sensitive materials.

The species (I) can function as a true catalyst of reaction and suffer no permanent change in composition. Alternatively, (I) can be consumed while initiating a chain reaction of the substrate. Since, in either case, the reactive species produced by the action of a single photon may result in the conversion of several substrate molecules to product, the effective quantum efficiency (number of product forming events per photon absorbed) can exceed unity. This multiplicative response constitutes chemical amplification of the initial photochemical act and affords a means of designing materials with high radiation sensitivity.

The majority of commercially important photoinitiators are nonmetallic compounds that generate radicals and/or strong acids upon irradiation. Well-studied examples include benzoin and benzoin ethers, benzyl ketals, benzophenones plus hydrogen atom donors, thiol-ene systems, and onium salts belonging to the aryldiazonium, triarylsulfonium, and diaryliodium families. Of the relatively few transition metal-containing photoinitiators reported to date, most are organometallic complexes possessing photolabile ligands such as carbon monoxide, olefins, and carbocyclic rings. While the details of the mechanisms of initiation in these systems are sketchy, the photoinduced formation of a coordinatively unsaturated metal center appears to be a central feature.

The ability of classical metal amine complexes to function as photoinitiators has been reported by Kutal, et al. In the *Journal of the Electrochemical Society*, Vol 134(9), 2280, 1987, Kutal and Willson reported that films spin-coated from solutions containing the copolymer of glycidyl methacrylate and ethyl methacrylate along with the transition metal coordination complex $[Co(NH_3)_5Br](ClO_4)_2$ undergo crosslinking upon irradiation at 254 nm and subsequent heating at 70° C. The mechanism of crosslinking was determined to proceed in two distinct stages: (i) the primary photochemical process involving redox decomposition of the cobalt complex; and (ii) one or more thermally activated reactions between the decomposition products and the pendant epoxide groups on the copolymer. The reactive species responsible for the photoinduced crosslinking by $[Co(NH_3)_5Br](ClO_4)_2$ was not elucidated in this work, but it was hypothesized to be either a released ammonia molecule (neutral base catalysis) or cationic cobalt (II) complex (cationic catalysis).

In the *Journal of Coatings Technology*, July 1990, Kutal, Weit, MacDonald and Willson reported that $Co(NH_2R)_5X^{n+}$ complexes, where R is methyl or n-propyl and X is Cl- or Br-, photoinitiate crosslinking reactions in films of the copolymer of glycidal methacrylate and ethyl acrylate at 254 nm. Irradiation of the cobalt complex at this wavelength causes efficient photoredox decomposition of the complex from a ligand-to-metal charge transfer excited state with release of several equivalents of free alkylamine. Even in the presence of oxygen, the decomposition quantum yields in solution can exceed 40%. The quantum yields for the alkylamine cobalt complexes are uniformly higher than those reported for the comparable ammonia complexes. It was also observed that $Co(NH_2Me)_5X^{2+}$ exhibits a greater photosensitivity than $Co(NH_3)_5X^{2+}$ in the crosslinking reaction, suggesting that the initiating species is the substituted amine or ammonia (neutral base catalysis), and that the sensitivity is a function of the basicity of the amine. See also *Advances in Resist Technology and Processing VIII*, Volume 1466 (1991).

Conspicuously absent from the current catalogue of photoinitiators are those that undergo photochemical release of an anionic initiating species. Such an initiator would be of great value to induce light-catalyzed polymerization or crosslinking of a wide range of monomers, oligomers and polymers. For example, aldehydes and ketones, as well as certain ethylenically unsaturated monomers, undergo anionic polymerization or crosslinking, including ethylene, 1,3-dienes, styrene and α-methyl styrene, acrylates and methacrylates, acrylonitrile, methacrylonitrile, acrylamide and methacrylamide. Certain monomers also undergo anionic ring-opening polymerization or crosslinking reactions, including N-carboxy-α-amino anhydrides, cyclic amides, cyclic esters, epoxides and siloxanes.

Therefore, it is an object of the present invention to provide photoinitiators for anionic polymerization or crosslinking.

It is another object of the present invention to provide a method to select compounds for use as anionic photoinitiators.

SUMMARY OF THE INVENTION

It has been discovered that irradiation of the ligand-field and/or charge transfer absorption bands of selected transition metal complexes can result in the controlled release of anionic initiators for photoinduced reactions of functionalized monomers, oligomers, and polymers.

A preferred inorganic complex for anionic photoinitiation is trans-$[Cr(NH_3)_2(NCS)_4]^-$ (Reineckate anion). The Reineckate anion dissolves readily in a variety of nonaqueous solvents, resists thermal substitution in nonhydroxylic media, and undergoes quantum efficient release of $NCS^-$ (eq. 4) upon ligand-field excitation with near-ultraviolet/ visible light. Photogenerated NCS⁻ can be used to initiate the polymerization of monomers that can be polymerized under anionic conditions. It can also be used to crosslink polymers.

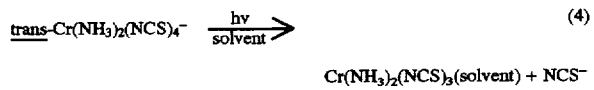

$$\text{trans-Cr(NH}_3)_2(\text{NCS})_4^- \xrightarrow[\text{solvent}]{h\nu} \quad (4)$$

$$\text{Cr(NH}_3)_2(\text{NCS})_3(\text{solvent}) + \text{NCS}^-$$

Other inorganic complexes that can be used as anionic photoinitiators include trans-Cr(en)$_2$(NCS)$_2^+$, trans-Co(en)$_2$Cl$_2^+$, and trans-Cr(en)$_2$ Cl$_2^+$ (en is ethylenediamine).

The invention also includes a method for selecting inorganic transition metal complexes for use as anionic photoinitiators that includes choosing complexes that release nucleophilic anions when irradiated with visible or ultraviolet radiation, have high quantum efficiency, are soluble in nonaqueous solvents, and are thermally stable for a reasonable time period.

DETAILED DESCRIPTION OF THE INVENTION

Figure 1:
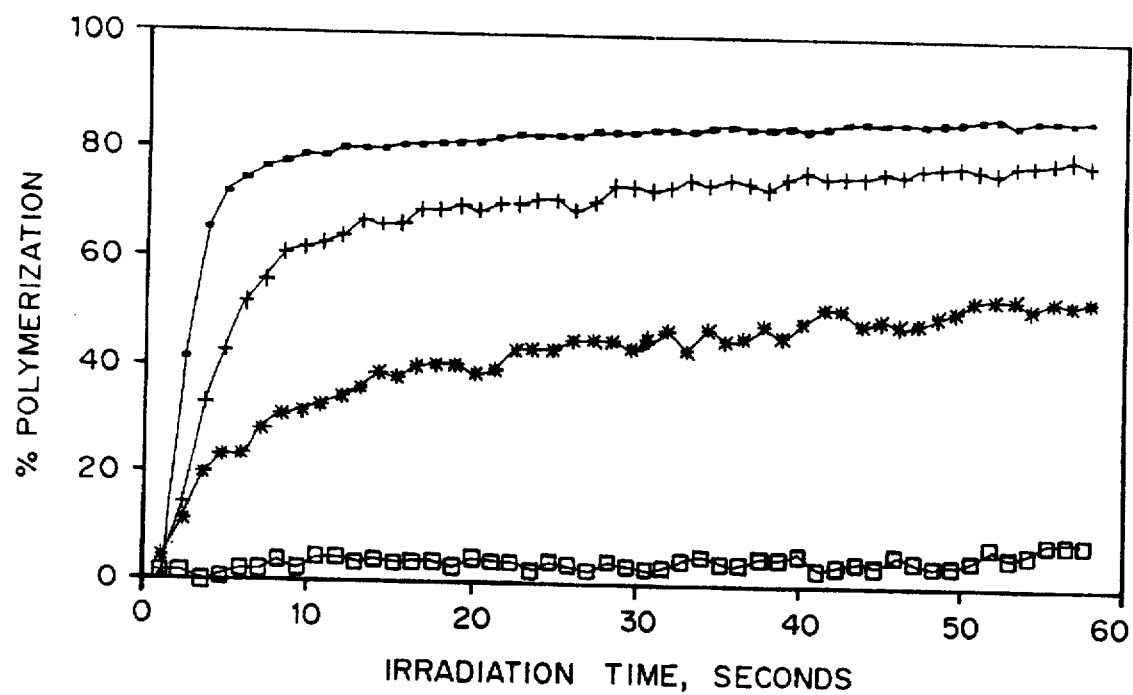
FIG. 1 is a plot of percentage polymerization vs. time of irradiation for samples of ethyl α-cyanoacrylate containing the following concentrations of Reineckate's anion: (□) 0M; (*) 2.2×10⁻⁴M; (+) 5.4×10⁻⁴M; (■) 2.0×10⁻³M. Samples were coated onto acid-treated silicon wafers and irradiated with 500 mW/cm² of polychromatic (300–630 nm) light.

As used herein, the term substrate refers to the compound, monomer, oligomer, or polymer that is acted on by the anionic photoinitiator. In general, the photoinitiator causes a change in the chemical composition and/or physical structure of the substrate, to produce a product (see equations 2-3).

As used herein, the term inorganic complex refers to an inorganic compound that contains a ligand that is capable of being released as a nucleophilic anion on irradiation with light of the appropriate wavelength.

As used herein, the term nucleophile refers to an electron rich moiety that will attack the nucleus of a carbon atom.

A method for anionic photoinitiation is provided that includes exposing the substrate to be polymerized or crosslinked to an inorganic transition metal complex that releases anions in a controlled fashion when irradiated. The metal complex is thermally stable, soluble in the reactants, and nonreactive in the absence of light.

The anionic photoinitiators can be used to prepare new classes of photoresponsive materials possessing optimal properties for specific applications, such as improved thermal stability, photosensitivity, and wavelength response. Such materials are needed in the microelectronics, coatings, and reprographic industries, specifically for lithographic photoresists, photocurable coatings, stereolithographic media, sealants, printing inks and adhesives.

The anionic photoinitiation of selected substrates can be characterized by absorption and luminescence spectroscopies, real-time Fourier transform infrared spectroscopy, quantum yield measurements, flash photolysis, reactive-ion-etching, and scanning electron microscopy.

I. Selection of Inorganic Complex as Anionic Photoinitiator

A. Method of Selection of the Inorganic Complex as an Anionic Photoinitiator

An inorganic transition metal complex should be chosen for use as an anionic photoinitiator that has the following characteristics.

1) The inorganic transition metal complex must release a nucleophilic anion on irradiation. The ability of the complex to initiate anionic polymerization or crosslinking is a function of the nucleophilicity of the released anion and the reactivity of the monomer or other substrate. In general, the nucleophilicity of anions in aqueous or alcoholic solution decreases in the order: CN⁻>I⁻>NCS⁻>OH⁻>Br⁻>N$_3^-$>NO$_2^-$>Cl⁻>F⁻. The complex may also release ⁻OR, wherein R is a straight or branched alkyl group, including but not limited to methyl, ethyl, propyl, butyl, and pentyl (linear and branched analogs). This order will change in nonhydroxylic solvents owing to differences in solvation energies.

Metal complexes that photochemically liberate hydroxide ion are particularly attractive, in light of the fact that this strong base is capable of initiating anionic polymerization or crosslinking of epoxides, as well as other moderately reactive species such as siloxanes. For example, addition of OH⁻ to the oxirane ring produces a reactive anionic species that can then attack a second ring. Repetition of this process results in polymerization or crosslinking with high effective quantum efficiency.

2) The release of the anion should be the result of excitation of the inorganic transition metal complex by visible, near-infrared, or ultra-violet light. Light of wavelength between approximately 400 and 750 nm is visible. Light of wavelength between 750 and 1000 nm is considered near-infrared radiation. Light of wavelength between 200 and 400 nm is considered ultraviolet radiation.

Generally, the absorption process causes the transfer of an electron from a molecular orbital with bonding or nonbonding character to a molecular orbital with antibonding character with respect to the central metal-anion bond. In the typical case, the inorganic metal complex undergoes a ligand field or a ligand-to-metal charge transfer transition when irradiated with light of a specific wavelength. The wavelength at which the absorption takes place can be determined by analysis of the complex's ultraviolet, visible, and near-infrared spectrum. For example, ligand-field absorption maxima occur at 392 and 520 nm for trans-Cr(NH$_3$)$_2$(NCS)$_4^-$, at 365, 414 and 487 nm for trans-Cr(en)$_2$ (NCS)$_2^+$, and at 406 and 619 nm for trans-Co(en)$_2$ Cl$_2^+$ in aqueous solution.

The ability to initiate useful chemistry when excited with long-wavelength light is a highly desirable feature of transition metal complexes. This can be used, for example, in photosensitive systems that respond to the output of inexpensive semiconductor-diode lasers.

3) The release of the anion from the transition metal complex should occur with high quantum efficiency, preferably 0.01 or larger. The term "quantum efficiency" refers to the ratio of the number of anions generated per photon absorbed by the complex. The numerator in this ratio, the moles of released anion, can be determined by several analytical techniques such as colorimetry, gravimetry, and specific-ion electrode measurements. The denominator of the quantum yield ratio, the moles of absorbed photons, is obtained by measuring the incident light intensity with a calibrated power meter or chemical actinometer such as ferrioxalate and then calculating the percentage of this radiation absorbed by the complex by use of Beer's Law.

Quantum efficiencies for photochemical release of anions from transition metal complexes vary depending upon the complex and reaction conditions. Irradiation of an acetonitrile solution of trans-Cr(NH$_3$)$_2$ (NCS)$^-_4$ with 465-nm light causes NCS⁻ release with a quantum efficiency of 0.26. Photolysis of an aqueous solution of trans-Co(en)$_2$Cl$_2$⁺ with 488-nm light generates Cl⁻ with a quantum efficiency of 0.0011. While quantum efficiencies of anion release near unity are desirable, values as low as 0.0001 may be acceptable in systems that incorporate chemical amplification. The effective quantum efficiency in a chemically-amplified system will be the product of the quantum efficiency of the photochemical step (eq. 2) and the average chain length or number of substrate units reacted per photogenerated initiator/catalyst species (eq. 3).

The desired polymerization chain length will vary depending on the desired end product, and can be determined without undue experimentation using known techniques. The number of substrate units undergoing polymerization or crosslinking can be obtained from gel permeation chromatography measurements of number and weight average molecular weights. Consumption of carbon-carbon double bonds in vinylic substrates can be quantitated by real time Fourier transform spectrometry.

EXAMPLE I

Multiplicity of Response to Reineckate's Anion by Ethyl α-cyanoacrylate

FIG. 1 is a plot of percentage polymerization vs. time of irradiation for samples of ethyl α-cyanoacrylate containing the following concentrations of Reineckate's anion: (□) 0M; (*) 2.2×10⁻⁴M; (+) 5.4×10⁻⁴M; (■) 2.0×10⁻³M. Samples were coated onto acid-treated silicon wafers and irradiated with 500 mW/cm² of polychromatic (300–630 nm) light. Under the rather conservative assumption that each Reineckate's anion in the sample undergoes photochemical release of one NCS⁻, a polymerization chain length of >10⁴ was calculated from the data in FIG. 1 for the 2.2×10⁻⁴M sample after irradiation from 30 seconds. This multiplicative response of ethyl α-cyanoacrylate to NCS⁻ constitutes chemical amplification and accounts for the high photosensitivity of this system.

4) The inorganic metal complex should be soluble in the pure substrate or in a solvent that also dissolves the substrate. Solubility of the complex in nonaqueous solutions is necessary to enable formulation with a range of organic substrates such as epoxides and acrylates. A typical photoresist formulation used for photolithography consists of an organic substrate, a photoinitiator, and a casting solvent. This formulation is spin-coated onto a silicon wafer to form a thin film and the solvent is then removed by heating. Common casting solvents include 2-butanone, cyclohexanone, and propylene glycol methyl ether acetate. For polymerization reactions, solubility of the inorganic photoinitiator in the monomer obviates the need for a solvent.

5) The inorganic metal complex should be thermally stable for a reasonable length of time, to provide a suitable shelf life. For many applications, a shelf life of 3–6 months at room temperature is desirable. Transition metal complexes in which the central metal possesses a d³, low-spin d⁶, or low-spin d⁸ electronic configuration are especially resistant to thermal release of ligands. Other examples of thermally stable complexes include those with metals in high formal oxidation states such as Mo(CN)$_8$⁴⁻. Shelf life is improved by minimizing the exposure of the complex to heat or light. Photopolymerizable solutions of trans-Cr(NH$_3$)$_2$(NCS)$_4$⁻ in ethyl α-cyanoacrylate remain usable for up to one month when stored in the dark at room temperature.

One approach for retarding the thermal substitution reactions of coordination complexes involves tethering the central metal with a macrocyclic ligand. For example, trans-Cr(cyclam)Cl$_2$⁺ (cyclam is 1,4,8,11-tetraazacyclotetradecane) undergoes thermal release of Cl⁻~10³ times more slowly than trans-Cr(en)$_2$Cl$_2$⁺. While the quantum yield for photoinduced Cl⁻ loss experiences a comparable reduction, this factor is easily compensated by employing a more intense light source (e.g. a laser rather than a conventional arc lamp).

B. Examples of Anionic Photoinitiators

Reineckate's Anion

Reineckate's anion, trans-[Cr(NH$_3$)$_2$(NCS)$_4$]⁻, is a preferred transition metal complex for anionic photoinitiation. The anion dissolves readily in a variety of nonaqueous solvents, resists thermal substitution in nonhydroxylic media, and undergoes quantum efficient release of the nucleophile NCS⁻ upon ligand-field excitation with near-ultraviolet/visible light at greater than 350 nm. Photochemical release of NH$_3$ or radicals from the Reineckate anion only occurs at much shorter wavelengths.

The photogenerated thiocyanate anion will attack an electron deficient carbon to create a new anionic reactive center.

Trans-Cr(en)$_2$(NCS)$_2$⁺

Trans-Cr(en)$_2$(NCS)$_2$⁺, a cationic analogue of Reinecke's salt, undergoes photochemical release of NCS⁻ under green light, and therefore can function as a photoinitiator for anionic polymerization. The complex is soluble in acetonitrile and acetone.

EXAMPLE 2

Anionic Polymerization of Ethyl α-Cyanoacrylate with Trans-Cr(en)$_2$(NCS)$_2$⁺

A solution containing 95% by volume of ethyl α-cyanoacrylate, 5% by volume acetonitrile, and 1.1×10⁻³M of trans-[Cr(en)$_2$(NCS)$_2$]PF$_6$ was exposed to 532-nm light from a Nd-YAG laser at an intensity of 2.9×10⁻⁶ einsteins/s. A solid plug of polymer formed in the path of the light beam after irradiation for 90 s.

Trans-Co(en)$_2$Cl$_2$⁺

EXAMPLE 3

Anionic Polymerization of Ethyl α-Cyanoacrylate with Trans-Co(en)$_2$Cl$_2$⁺

A solution containing 95% by volume of ethyl α-cyanoacrylate, 5% by volume of acetonitrile, and 2.0×10⁻³M trans-[Co(en)$_2$Cl$_2$]PF$_6$ was exposed to 355-nm light from a Nd-YAG laser at an intensity of 2.2×10⁻⁶ einsteins/s. After 346 s of irradiation, the viscosity had increased to the point where it was no longer possible to spin a magnetic stirbar in the solution.

This cobalt complex is very stable thermally in solution. There is a low quantum yield of Cl⁻ release in the visible region and the probable release of ethylenediamine, an uncharged base, along with Cl⁻ at 355 nm. Thus more than a single species may be involved in initiating polymerization at this shorter wavelength.

Trans-Cr(en)$_2$Cl$_2$⁺

Trans-[Cr(en)$_2$Cl$_2$]Cl can be prepared by the method described by G. Brauer in *Handbook of Preparative Inor-* ganic Chemistry, 2nd Ed., vol. 2, Academic Press: New York, 1965, p. 1357–1358. Simple metathesis with $NH_4PF_6$ converts the complex to its $PF_6^-$ salt. Irradiation into the first spin-allowed ligand field absorption band of trans-Cr(en)$_2Cl_2^+$ is known to cause release of Cl$^-$ with a quantum efficiency of 0.32 in aqueous solution (see *Canadian Journal of Chemistry*, vol. 48, 1524, 1971). It has been discovered that Cl$^-$ is an effective initiator for the anionic polymerization of ethyl α-cyanoacrylate. Thus as little as $1.3 \times 10^{-4}$ M Cl$^-$ causes 0.5 mL of ethyl α-cyanoacrylate to polymerize in less than 1 s. A 532-nm irradiation of a solution containing 95% by volume of ethyl α-cyanoacrylate, 5% by volume of acetonitrile as co-solvent, and $2.0 \times 10^{-3}$ M trans-[Cr(en)$_2Cl_2$]PF$_6$ can be used to induce photoinitiated anionic polymerization of the acrylate monomer.

II. Examples of Substrates that can be Treated with the Anionic Photoinitiator

Monomers, oligomers, and polymers that can be modified by anionic photoinitiation are those that are capable of reaction on attack by an anionically charged nucleophile, including but not limited to ethylene, 1,3-dienes, styrene and α-methyl styrene, acrylates and methacrylates, acrylonitrile, methacrylonitrile, acrylamide and methacrylamide, and aldehydes and ketones, and oligomers and polymers containing these moieties. Suitable substrates also include monomers, oligomers, and polymers that undergo anionic ring-opening polymerization or crosslinking reactions, for example, N-carboxy-α-amino anhydrides, cyclic amides, cyclic esters, epoxides and siloxanes.

Preferred monomers are ethylenically unsaturated monomers that contains electron-withdrawing substituents to stabilize the negative charge, for example, ethyl α-cyanoacrylate (see equation 5) and methyl α-trifluromethylacrylate.

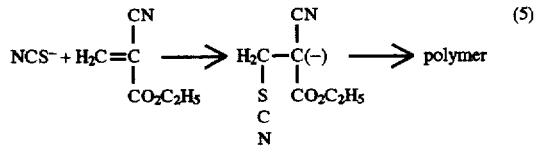

$$NCS^- + H_2C=\underset{\underset{CO_2C_2H_5}{|}}{\overset{\overset{CN}{|}}{C}} \longrightarrow H_2C-\underset{\underset{CO_2C_2H_5}{|}}{\overset{\overset{CN}{|}}{\underset{\underset{N}{\overset{C}{|}}}{\overset{S}{|}}}}C(-) \longrightarrow polymer \quad (5)$$

In general, an anionic photoinitiator is selected that will react with the substrate to be modified or polymerized. The more nucleophilic the anion released from the excited metal complex, the less electrophilic the substrate is required to be. For example, ethyl α-cyanoacrylate is quite reactive because the electron-withdrawing effect of the cyano group causes the β-carbon to be highly electrophilic. Almost any anion will initiate polymerization of this monomer, including thiocyanate, bromide, and azide ion. Methyl α-trifluoromethylacrylate is also quite reactive because the α-trifluoromethyl group has a strong inductive effect. In contrast, ethylene does not contain an electron withdrawing group and thus polymerization of this monomer must be initiated by a strong nucleophile, such as n-butyl carbanion. N-carboxy-α-amino anhydrides, cyclic amides, cyclic esters, epoxides and siloxanes can be initiated with alkoxide or hydroxide ion.

III. Anionic Photoinitiation Process

The photoinitiator can be dissolved in neat monomer (e.g. Reinecke's salt in ethyl α-cyanoacrylate) or in a solution of substrate and a co-solvent (e.g. trans-Cr(en)$_2$(NCS)$_2^+$ in 95% ethyl α-cyanoacrylate and 5% acetonitrile).

If a co-solvent is employed, it should not undergo proton transfer equilibria, since this would provide a pathway for scavenging anion species active in initiating and propagating polymerization. Examples of preferred solvents are diethyl ether, tetrahydrofuran, and acetonitrile. It is typically desired, but not required, that the complex have a solubility of at least $1 \times 10^{-4}$ M in the cosolvent.

The anionic photoinitiation reaction can be carried out at any temperature that provides the desired results. A temperature of between 20°–30° C. is suitable in many cases, since higher temperatures favor thermal release of anions and lower temperatures may cause solubility problems.

Any amount of photoinitiator can be used that suitably initiates the desired reaction. An amount of photoinitiator in the formulation ranging from parts per million to part per hundred is typically suitable depending upon the system and desired applications.

Anionic photoinitiation is retarded in the presence of acids that neutralize the anion, or nucleophile. Certain unsaturated monomers used in chain polymerization reactions contain compounds that act as radical or basic scavengers, that are in fact acids and that can interfere with the anionic polymerization reaction.

The material with the anionic photoinitiator should be maintained in the absence of radiation of the wavelength that will initiate reaction, until reaction is desired.

The method is described below for convenience with reference to the reaction of ethyl α-cyanoacrylate with Reineckate's anion. However, it should be understood that the present invention is not limited to these examples but includes all of the embodiments described above.

EXAMPLE 4

Anionic Photoinitiation of α-Cyanoacrylate by Reineckate's Anion

Neat ethyl α-cyanoacrylate (99.88% purity from Loctite Corporation) is a colorless liquid with a viscosity of 2.8 cP at 22° C. The sample employed in this study contained scavengers for adventitious radical and basic impurities. Commercially available ammonium salt of Reineckate's anion (Alfa) was converted to the potassium salt ($K^+R^-$). Solutions of ethyl α-cyanoacrylate containing $K^+R^-$ ($0.19$–$2.7 \times 10^{-3}$ M) undergo no change in viscosity when kept in the dark for one week at room temperature. In contrast, mixing one drop of a $5.2 \times 10^{-3}$ M solution of $K^+NCS^-$ in acetonitrile with 0.5 mL of ethyl α-cyanoacrylate causes immediate (<1 s) solidification accompanied by considerable evolution of heat. This dramatic response establishes NCS$^-$ as an effective initiator for the polymerization of ethyl α-cyanoacrylate.

The electronic absorption spectrum of $K^+R^-$ dissolved in ethyl α-cyanoacrylate exhibits bands at 400 nm ($\epsilon = 89 M^{-1} cm^{-1}$) and 528 nm ($\epsilon = 114 M^{-1} cm^{-1}$) arising from spin-allowed ligand field transitions. Selective excitation (532 or 546 nm) of the lower-energy transition causes the solution to thicken and eventually solidify. This behavior is the direct consequence of the photochemical release of NCS$^-$ which, as noted above, functions as an effective initiator for polymerization. The key role played by anionic species is underscored by the observation that increased levels of base scavenger (a protonic acid) in the monomer sample inhibits polymerization. This effect is attributed to the ability of the protonic acid to scavenge photogenerated NCS$^-$ and/or anionic sites on the growing polymer chain.

EXAMPLE 5

The Effect of Concentration of Anionic Photoinitiator and Incident Light Intensity on Rate of Polymerization Ethyl α-cyanoacrylate (2 mL) containing various concentrations of $K^+R^-$ were irradiated (with stirring in runs a–c)

in a 1-cm rectangular Pyrex cell, as described in Table 1. No attempt was made to exclude air from the sample. The dependence of photoinitiated polymerization on the $K^+R^-$ concentration and the incident light intensity is provided in Table 1. At constant intensity, polymerization proceeds more rapidly at higher complex concentration (compare runs a and c). Such behavior reflects the greater fraction of light absorbed by the more concentrated sample and the correspondingly higher photochemical rate of $NCS^-$ release. An analogous explanation accounts for the faster polymerization observed upon increasing light intensity at constant $K^+R^-$ concentration (compare runs a and b).

TABLE 1

Effects of $K^+R^-$ Concentration and Light Intensity Upon the Rate of Photoinitiated Polymerization of Ethyl α-Cyanoacrylate

| run | $[K^+R^-]$, M | λex, nm | I, einsteins/s[a] | polymerization time, s[b] |
|-----|---------------|---------|-------------------|---------------------------|
| a | $2.1 \times 10^{-3}$ | 546 | $3.97 \times 10^{-8}$ | 880 |
| b | $2.1 \times 10^{-3}$ | 546 | $2.08 \times 10^{-8}$ | 1540 |
| c | $5.1 \times 10^{-4}$ | 546 | $3.97 \times 10^{-8}$ | 3380 |
| d | $2.0 \times 10^{-3}$ | 532 | $2.13 \times 10^{-6}$ | 6 |
| e | $6.0 \times 10^{-4}$ | 532 | $2.13 \times 10^{-6}$ | 12 |
| f | $2.0 \times 10^{-4}$ | 532 | $2.13 \times 10^{-6}$ | 45 |

[a]Incident light intensity. Light at 546 nm was obtained by passing the output of a 200-W high-pressure mercury lamp through a narrow bandpass interference filter, while a Nd-YAG pulsed laser operated at 10 Hz was used for irradiations at 532 nm.
[b]Time required for sample to become so viscous that stirring bar ceased to spin (runs a–c), or time required for the formation of a solid plug of polymer along the path of the 7-mm diameter laser beam (runs d–f).

EXAMPLE 6

Kinetic Characterization of Anionic Photoinitiation

A more detailed kinetic characterization of the photoinitiated polymerization process of ethyl α-cyanoacrylate using Reineckate's anion was obtained by real-time Fourier-transform infrared spectroscopy. This relatively new technique allows continuous monitoring (up to 204 infrared spectra collected per minute) of the sample during irradiation. The extent of polymerization is directly related to the decrease in absorbance of the C=C stretching band of ethyl α-cyanoacrylate at 1616 cm$^{-1}$. This relationship is expressed in eq. 6, where $A_0$ denotes the initial (dark) area of the band and $A_t$ is the area after t $$\% \text{ polymerization} = \frac{(A_0 - A_t)}{A_0} \times 100 \quad (6)$$

seconds of irradiation.

FIG. 1 is a plot of percentage polymerization vs. time of irradiation for samples of ethyl α-cyanoacrylate containing the following concentrations of Reineckate's anion: (□) 0M; (*) $2.2 \times 10^{-4}$M; (+) $5.4 \times 10^{-4}$M; (■) $2.0 \times 10^{-3}$M. Samples were coated onto acid-treated silicon wafers and irradiated with 500 mW/cm$^2$ of polychromatic (300–630 nm) light.

The data shown in FIG. 1 agree with earlier observations (Table 1) that polymerization occurs more rapidly in samples containing higher $K^+R^-$ concentrations. The rate of photoinitiated polymerization, $R_p$, can be calculated from eq. 7, where $A_{t1}$ and $A_{t2}$ represent the areas under the 1616 cm$^{-1}$ band at irradiation times t1 and t2, and M is the molar concentration of vinyl groups in ethyl α-cyanoacrylate. Maximum rates of 3.0, 1.3, and 0.60 M·s$^{-1}$ result for ethyl α-cyanoacrylate samples containing $2.0 \times 10^{-3}$, $5.4 \times 10^{-4}$, and $2.2 \times 10^{-4}$M concentrations of $K^+R^-$, respectively.

$$R_p = \frac{M(A_{t1} - A_{t2})}{A_0(t1 - t2)} \quad (7)$$

This data demonstrates that visible-light irradiation of trans-$[Cr(NH_3)_2(NCS)_4]^-$ dissolved in ethyl α-cyanoacrylate initiates anionic polymerization. The initiation step involves addition of photoreleased NCS$^-$ to the carbon-carbon double bond of the acrylate monomer.

This invention has been described with reference to its preferred embodiments. Variations and modifications of the invention, anionic photoinitiation, will be obvious to those skilled in the art from the foregoing detailed description of the invention. It is intended that all of these variations and modifications be included within the scope of the appended claims.

I claim:

1. A method for polymerizing a monomer or oligomer or crosslinking an oligomer or polymer, in the absence of protic solvents, comprising irradiating a mixture of a monomer, oligomer, or polymer and an inorganic transition metal complex, under irradiation conditions sufficient for the inorganic transition metal complex to photochemically react to release a polymerization initiating substance consisting essentially of an anionically charged nucleophile, and said anionically charged nucleophile initiates a polymerization reaction of said monomer or oligomer or a crosslinking reaction of said oligomer or polymer, in the absence of protic solvents to form a product polymer material.

2. The method of claim 1 wherein the monomer, oligomer, or polymer is selected from the group consisting of ethylene, 1,3-diene, styrene, α-methyl styrene, acrylate ester, methacrylate ester, acrylonitrile, methacrylonitrile, acrylamide, methacrylamide, aldehydes, and ketones.

3. The method of claim 1, wherein the monomer, oligomer, or polymer is selected from the group consisting of N-carboxy-α-amino anhydrides, cyclic amides, cyclic esters, epoxides, and siloxanes.

4. The method of claim 1, wherein the inorganic transition metal complex is trans-$[Cr(NH_3)_2(NCS)_4]^-$.

5. The method of claim 1, wherein the inorganic transition metal complex is selected from the group consisting of trans-$Cr(en)_2(NCS)_2^+$ and trans-$Co(en)_2Cl_2^+$.

6. The method of claim 1, wherein the inorganic transition metal complex is selected from the group consisting of trans-$Cr(cyclam)Cl_2^+$, trans-$Cr(cyclam)(NCS)_2^+$, trans-Co(cyclam) $Cl_2^+$, trans-$Cr(R)_2(OH)_2^+$, trans-$Cr(R)_2(OH)H_2O^{2+}$, and trans-$Cr(R)_2(OH)Cl^+$, {and $Pb(OH)_6^{2-}$}, wherein R is selected from the group consisting of ethylenediamine and 1,3-propylenediamine.

7. The method of claim 1, wherein the radiation is near-ultraviolet or visible light.

8. The method of claim 1, wherein said method comprises crosslinking the polymer or oligomer.

9. The method of claim 1, wherein said method comprises polymerizing the oligomer or monomer.

10. The method of claim 1, wherein the inorganic transition metal complex is thermally stable.

11. The method of claim 1, wherein the inorganic transition metal complex does not release said anionically charged nucleophile in the absence of light.

12. The method of claim 1, wherein said polymer product material is incorporated into a product selected from the group consisting of lithographic photoresists, stereolithographic media, photocurable coatings, adhesives, sealants, and printing inks.

13. The method of claim 1, wherein the irradiation causes a ligand field or ligand-to-metal charge transfer transition in the inorganic complex.

14. A method polymerizing a monomer or oligomer or crosslinking an oligomer or polymer comprising the step of irradiating a mixture of said monomer, oligomer, or polymer and an inorganic transition metal complex, under irradiation conditions sufficient for the inorganic transition metal complex to photochemically react to release a polymerization initiating substance consisting essentially of an anionically charged and said anionically charged nucleophile initiates a polymerization reaction of said monomer or oligomer or a crosslinking reaction of said oligomer or polymer, wherein:

(i) the inorganic transition metal complex releases a nucleophilic anion when irradiated with visible or ultra-violet radiation;

(ii) the inorganic transition metal complex has a quantum efficiency of anion release from the complex of at least 0.0001;

(iii) the inorganic transition metal complex has a solubility in a nonaqueous solvent of at least $1 \times 10^{-4}$ M;

(iv) the inorganic transition metal complex is thermally stable at room temperature for at least 1 month, and (v) the polymerizing or crosslinking reactions occur in the absence of protic solvents.

15. The method of claim 14, wherein the anionically charged nucleophile is selected from the group consisting of $CN^-$, $I^-$, $Br^-$, $N_3^-$, $NO_2^-$, $Cl^-$, $F^-$, $SCN^-$, $OH^-$, and $OR^-$, wherein R is a straight or branched alkyl group.

16. The method of claim 15, wherein R is selected from the group consisting of methyl, ethyl, and t-butyl.

17. The method of claim 1, wherein the anionically charged nucleophile is selected from the group consisting of $CN^-$, $I^-$, $Br^-$, $N_3^-$, $NO_2^-$, $Cl^-$, $F^-$, $SCN^-$, $OH^-$, and $OR^-$, wherein R is a straight or branched alkyl group.

18. The method of claim 17, wherein R is selected from the group consisting of methyl, ethyl, and t-butyl.

* * * * *